United States Patent
Weinert

(10) Patent No.: US 7,746,668 B2
(45) Date of Patent: Jun. 29, 2010

(54) GALVANICALLY ISOLATED DIRECT CURRENT TRANSDUCER

(75) Inventor: Han-Christian Weinert, Bochum (DE)

(73) Assignee: Werner Turck GmbH & Co. KG (DE)

( * ) Notice: Subject to any disclaimer, the term of this patent is extended or adjusted under 35 U.S.C. 154(b) by 444 days.

(21) Appl. No.: 11/691,630

(22) Filed: Mar. 27, 2007

(65) Prior Publication Data
US 2007/0228841 A1 Oct. 4, 2007

(30) Foreign Application Priority Data
Mar. 29, 2006 (DE) .................. 10 2006 014 460

(51) Int. Cl.
*H02M 3/00* (2006.01)
(52) U.S. Cl. ........................................ 363/15
(58) Field of Classification Search .................. 363/15, 363/16, 123, 125, 131
See application file for complete search history.

(56) References Cited

U.S. PATENT DOCUMENTS

| 5,077,486 A | * | 12/1991 | Marson et al. | ............... 205/728 |
| 2006/0209576 A1 | * | 9/2006 | Yasumura | .................... 363/22 |

FOREIGN PATENT DOCUMENTS

| DE | 23 42 294 | 2/1975 |
| DE | 31 39 963 | 6/1982 |
| DE | 33 11 535 | 10/1984 |
| DE | 20 2004 012 817 | 10/2004 |
| WO | WO 2005053142 A1 * | 6/2005 |

* cited by examiner

*Primary Examiner*—Adolf Berhane
(74) *Attorney, Agent, or Firm*—St. Onge Steward Johnston & Reens LLC

(57) ABSTRACT

The invention relates to a switching device for galvanically isolated 1:1 transmission of a direct current signal, with a transformer comprising a primary coil and a secondary coil, wherein the primary coil is powered with alternating current derived from an input direct current and the current induced in the secondary coil is rectified, and with a correction device for compensating transmission losses. To provide a DC transducer free of auxiliary energy, in which the output current is as close to equaling the input current as possible, it is proposed that the number of turns on the primary coil should be greater than the number of turns on the secondary coil.

15 Claims, 3 Drawing Sheets

GALVANICALLY ISOLATED DIRECT CURRENT TRANSDUCER

CROSS-REFERENCE TO RELATED APPLICATIONS

The present application claims priority of German Patent Application No. 10 2006 014460.0-35, filed on Mar. 29, 2006, the content of which is incorporated herein by reference.

FIELD OF THE INVENTION

The invention relates to a switching device for galvanically isolated transmission of a direct current signal with a transformer comprising a primary coil and a secondary coil, wherein the primary coil is powered with alternating current derived from an input direct current and the current induced in the secondary coil is rectified, and with a correction device for correcting conversion losses.

BACKGROUND OF THE INVENTION

This type of DC transducer with galvanic isolation are known for instance from DE 33 11 535 A1 or DE 20 2004 012 817 U1. A general problem with this type of AC rectifier switches is their energy requirement, which necessarily leads to a reduction in the output current. The primary current is transformed by a converter into an alternating current. This alternating current is transformed by a 1:1 transformer. The secondary current isolated galvanically from it is rectified. The entire switch must have very low loss, so that incoming and outgoing current are as close to equalized as possible. To reduce transformer losses, non-leaking single-aperture core transformers are used. Such transformers are, first of all, expensive. Secondly, single-aperture core transformers have a problem concerning high voltage tolerance, and it is impossible to correct bulk resistance or temperature influence.

The use of this type of DC transducers occurs especially in explosion-risk areas. In such areas, electrical systems galvanically isolated from the environment are found, such as sensors and actuators. The sensor signals can be current signals. As a rule, the sensor signal is a direct current. This direct current is the input current for the DC transducer. The input direct current should optimally be equal to the output direct current. This ideal situation cannot be achieved with conventional switches. Portions of the input current flow out in the form of parallel currents, transformer losses, or other loss currents over the entire switch. The sum of all loss currents is missing in the output current. To correct this, an additional current should be added to the output current. The state of the art sometimes makes use of auxiliary energy sources for this purpose.

DE 3139963 describes a switching device for galvanically isolated 1:1 transmission of a direct current signal. A measurement transformer is placed in the primary current circuit with a ticker, which produces an alternating current that is transmitted by a transducer to a rectifier. Here too an additional current source is provided. The DC transducer depicted in DE 2342294 also requires an additional current source in order to compensate for losses.

SUMMARY OF THE INVENTION

It is the object of the invention to provide an auxiliary energy-free DC transducer in which the output current is as close to equaling the input current as possible.

This object is fulfilled through the invention indicated in the Claims.

Claim 1 provides first, and essentially, that the number of turns in the primary coil is greater than the number of turns in the secondary coil. As a result of this departure from the 1:1 transmission ratio of the transformer, the secondary current is essentially greater than the primary current. In general it is sufficient if the secondary coil has one turn less than the primary coil. Then the primary coil can, for instance, have 25 turns and the primary secondary coil can have 24 turns. This is sufficient to produce an output current that is always higher than the input current, minus the losses. The residual different between input current and output current is compensated by a correction device. The correction device preferably produces a correction current. This device works as a current divider. The correction current is split off from the input current, so that only part of the input current is conducted to the converter or to the primary coil. The correction switch can also be applied on the secondary side. However, because of the greater available voltage, it is advantageous to position the correction switch on the primary side. The correction switch can also compensate for the influence of changes in bulk. The bulk may not be measured directly on the primary side, of course. According to the rules of impedance transformation, however, the input impedance of the transformer is a function of the output impedance, that is, of the bulk resistance. Because the input current of the transformer is a function of the input current and of the bulk, the bulk influence can be measured indirectly by the input voltage of the transformer or of the converter and can be drawn upon to produce the required correction current. For optimal high-voltage-proof galvanic isolation of the coils of the transformer, these coils are configured as planar coils. These planar coils can be configured by pressed conducting lines on a conductor circuit board. The planar coils can be linked to a common circuit board, wherein primary coil and secondary coil can be linked to the two contrary-pointing sides of one circuit board. It is also possible to use multi-layered circuit boards. The configurations of the coils as pressed planar coils has, in addition, an advantage in terms of manufacturing technology, because the transformers can be produced with minimal mass production tolerance. The departures from transmission behavior or of the losses of individual transformers within one manufacturing series are very low. On the primary side is found a correction device in the form of a current divider. A correction current is diverted from the input current so that only a reduced current is conducted to a converter. This converter makes the direct current into alternating current, which flows through the primary coil. Because of the different numbers of rounds in the primary and secondary coils, an increased current flows through the secondary coil. This secondary current is rectified with a rectifier switch. The rectified output current flows through the bulk and is essentially equal to the input current. As a result of the inventive concept, all reproducible losses or other influential factors can in theory be corrected, including in particular measurement errors owing to the influence of bulk, measurement errors owing to the temperature influence, and measurement errors owing to switching losses. In providing the correction current, the current required to operate the correction device is of course also taken into account. With the inventive device, not only measurement signals from an explosion-proof area can be carried out. It is also possible to bring control signals into an explosion-proof area. The secondary current then serves for the powering of an actuator.

An embodiment of the invention is described hereafter with reference to the annexed illustrations.

DETAILED DESCRIPTION OF THE INVENTION

Figure 1:
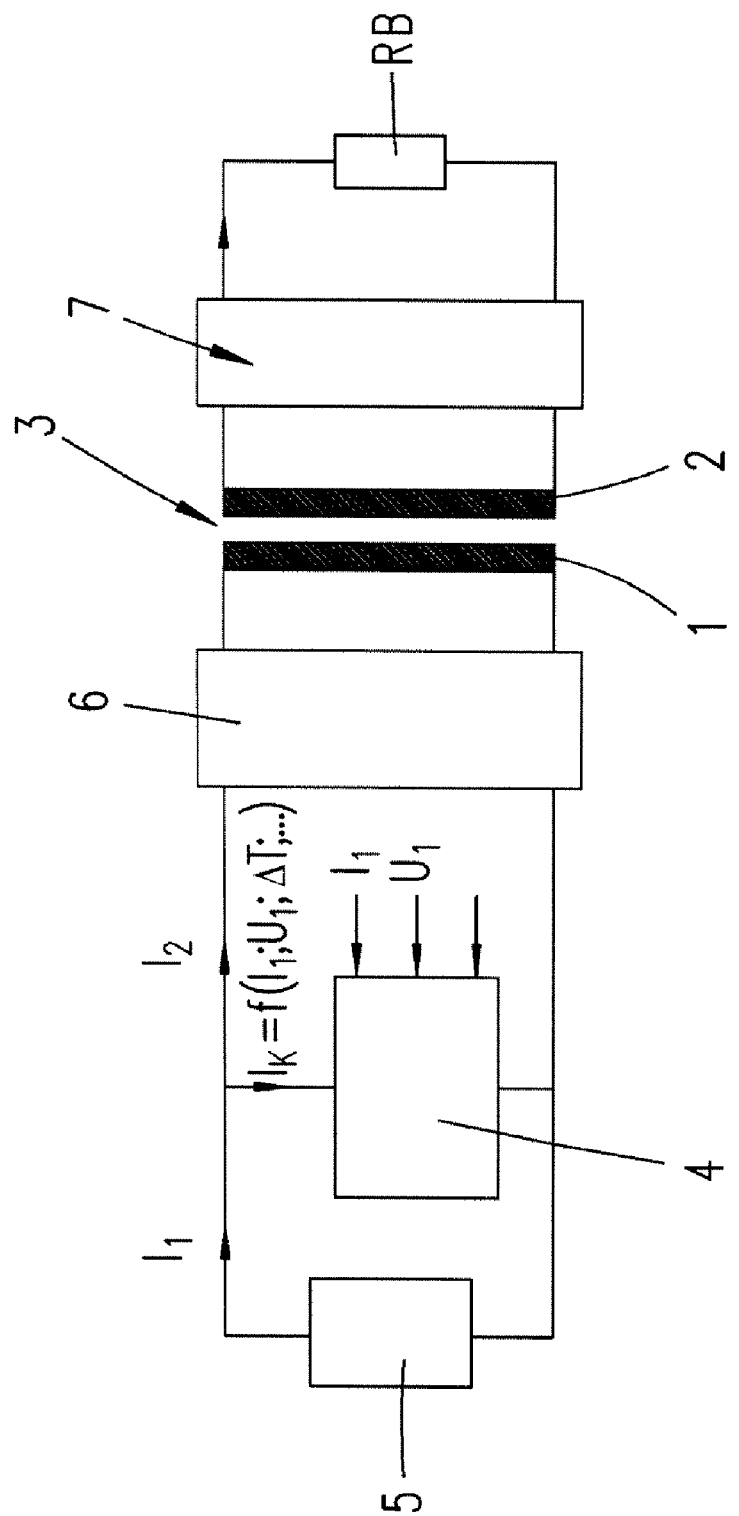
FIG. 1 shows the essential components of a DC transducer in the manner of a block diagram.
Figure 2:
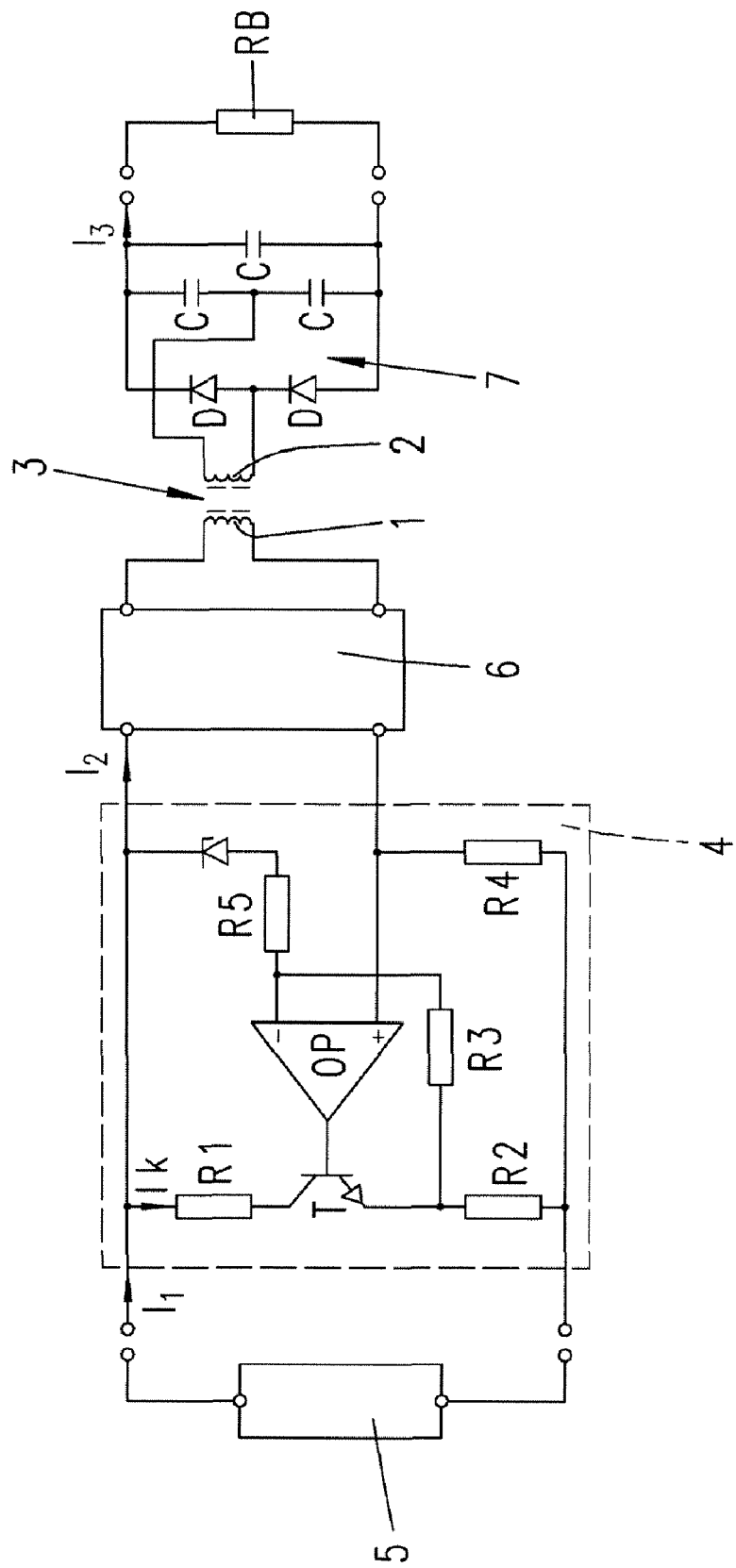
FIG. 2 shows a detailed depiction of the DC transducer.
Figure 3A:
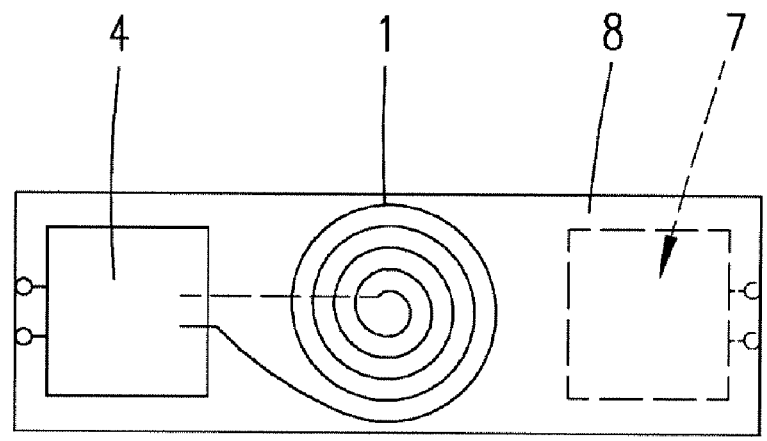
FIG. 3a shows a schematic view of a circuit board arrangement seen from the front.
Figure 3B:
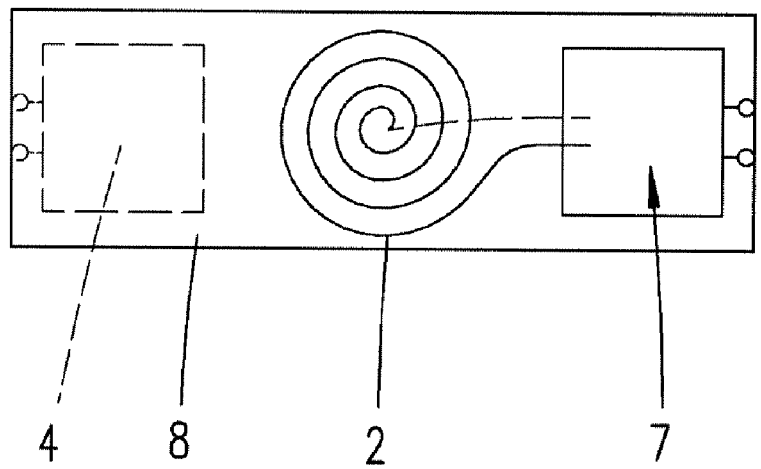
FIG. 3b shows a schematic view of the circuit board from the rear.

The embodiment shown in the illustrations is an auxiliary energy-free DC transducer with galvanic isolation. A transformer 3 serves for galvanic isolation. This transformer comprises a primary coil 1 and a secondary coil 2. It can be seen from FIGS. 3a and 3b that both the primary coil 1 and the secondary coil 2 are configured by planar coils. Both coils possess spiral-shaped turns, which are pressed upon the two contrary-facing sides of a conductor plate. The primary coil 1 and the secondary coil 2 are congruent in area with one another. The number of primary turns is greater than the number of secondary turns, so that the secondary voltage of the transformer 3 is smaller than the primary voltage of the transformer 3. The secondary current, however, is greater than the primary current.

Reference number 5 stands for a current source on the primary side, which can be a sensor positioned in an explosion-risk area. The sensor signal is supplied, for instance, in the form of an output current that can measures between 0 and 20 mA. This input current I1 should be equal to an input current I3 that flows through a bulk resistance RB on the secondary side. The secondary side can lie outside the explosion-risk area and is galvanically isolated from the primary current circuit.

The current divider switch, which serves to divert the surplus primary current, has an operation amplifier OP. This amplifier, together with a transistor T, forms a voltage-driven current source that controls the correction current IK. The current source is directed by the voltage existing at the outlet of the operation amplifier OP. In the process the operation amplifier OP assesses the input current I1 by means of a shunt resistance. By means of a Diode D, the operation amplifier OP can assess the input currency U1 of the rectifier 6. The current and voltage determine the correction current that is diverted from the input current I1.

The correction switch 4 produces a correction current IK, which flows through the resistances R1, R2 and the transistor T. The output of the operating amplifier OP lies on the basis of the transistor T. The operation amplifier takes up the input current through the shunt resistance R4 and the input voltage of the converter switch 6 through the resistance R5 or the diode D. Both values thus determine the correction current IK. Because the input voltage of the transformer is measured, the bulk influences are also indirectly taken into account because according to the rules of impedance transformation they are formed in the input impedance of the transformer. In addition the correction device 4 takes into account all other linear current- or voltage-depend losses such as for instance their own current usage. The correction current IK is thus a function of the input current I1 and the input voltage U1. Additional parameters influencing the output current and the transmission characteristic of the switch can also be included through additional switching actions. For instance, temperature-dependent components should be received for a compensation of dependency on the ambient temperature R2 and R5.

On the secondary side, a rectifier switch 7 is provided, which in the embodiment consists of two diodes D and altogether three condensers C.

Because of the reduction ratio of the transformer 3, it is not necessary to use a complex, nearly loss-free transformer. In the embodiment a transformer arrangement is used which is marked by relatively high losses or transmission errors. These transformer characteristics, however, which are in themselves negative, may also be produced to be highly precise, that is, reproducible with very low manufacturing tolerances. By means of the correction device 4, these known values, which depart from the ideal behavior of a transformer, can be compensated or corrected. The concept demands the production of a current surplus on the secondary side, so that the surplus is uncoupled by a current divider. The correction switch 4 could also be positioned entirely on the secondary side. Voltage is available, however, on the primary side which is clearly greater than the secondary voltage because of the modified transmission ratio and losses in the transformer.

Unlike in single-aperture-core transformers, the planar converter used here is distinguished by a strong endurance of high voltage, precise reproducibility, and cost benefits. The losses influenced by the low-tolerance design are compensated precisely by the current from the correction device.

The described device is not only qualified to derive sensor signals from an explosion-proof area. The device is also qualified to incorporated control signals into an explosion-proof area. I3 then supplies the control current for an actuator. I1 is supplied by a control organ.

What is claimed is:

1. A switching device for galvanically isolated 1:1 transmission of a direct current signal with a transformer that comprises a primary coil, a secondary coil and a correction device, wherein the primary coil is powered with an alternating current obtained from an input direct current, and wherein the alternating current is transformed into a secondary current that is greater than the alternating current and the secondary current induced in the secondary coil is rectified to form a rectified output current, characterized in that the number of turns on the primary coil is greater than the number of turns on the secondary coil, and characterized in that the correction device compensates for the difference between the input direct current and rectified output current.

2. The switching device of claim 1, characterized in that the correction device is positioned ahead of the primary coil and in particular of a rectifier that supplies the primary alternating current.

3. The switching device of claim 1, characterized in that the correction device is a current divider.

4. The switching device of claim 3, characterized in that the correction current obtained by the current divider is dependent on the input voltage of the transformer that is modified by a change in the bulk.

5. The switching device of claim 1, characterized in that the coils are planar coils.

6. The switching device of claim 5, characterized in that the planar coils are configured by pressed conducting lines.

7. The switching device of claim 1, characterized in that the planar coils are positioned on a common conductor circuit board.

8. The switching device of claim 1, characterized in that the correction current produced by the correction device is a function of the input current of the primary coil, the input voltage, the ambient temperature, the various internal losses, and the current requirement of the correction device itself.

9. The switching device of claim 1, characterized in that the current induced in the secondary coil is greater than current induced by the primary coil.

10. The switching device of claim 1, characterized in that the correction current is split off from the input direct current.

11. The switching device of claim 1, characterized in that primary and secondary coils possess spiral-shaped turns.

12. The switching device of claim 1, characterized in that the primary coil forms a primary current circuit, and the secondary coil forms a secondary current circuit, such that the secondary current circuit is galvanically isolated from the primary current circuit.

13. The switching device of claim 12, characterized in that the primary current circuit can lie within an explosion-risk area.

14. The switching device of claim 12, characterized in that the secondary current circuit is rectified with a rectifier switch.

15. The switching device of claim 1, wherein the direct input current is provided by a sensor.

* * * * *